United States Patent [19]
Eckstein et al.

[11] Patent Number: 4,961,886
[45] Date of Patent: Oct. 9, 1990

[54] METHOD OF CONTROLLING FLOW BY A RADIATION FORMED DAM

[75] Inventors: Mark H. Eckstein; Michael A. Lutz, both of Midland, Mich.

[73] Assignee: Dow Corning Corporation, Midland, Mich.

[21] Appl. No.: 204,436

[22] Filed: Jun. 9, 1988

[51] Int. Cl.$^5$ .............................................. B29C 35/08
[52] U.S. Cl. ...................................... 264/22; 264/236; 264/347; 425/174.4; 427/43.1; 427/54.1
[58] Field of Search ......... 264/22, 236, 347, DIG. 46, 264/298, 107; 427/43.1, 54.1; 425/174.4

[56] References Cited

U.S. PATENT DOCUMENTS

| | | | |
|---|---|---|---|
| 3,767,445 | 10/1973 | Chandross et al. | 427/54.1 |
| 4,139,654 | 2/1979 | Reed | 264/22 |
| 4,353,858 | 10/1982 | Gilleo et al. | 264/268 |
| 4,409,264 | 10/1983 | Gilleo et al. | 427/265 |
| 4,452,748 | 6/1984 | Lange et al. | 264/107 |
| 4,514,345 | 4/1985 | Johnson et al. | 264/22 |
| 4,567,006 | 1/1986 | Covington et al. | 264/22 |
| 4,780,486 | 0/1988 | Lee et al. | 522/14 |

FOREIGN PATENT DOCUMENTS

| | | | |
|---|---|---|---|
| 60-161119 | 8/1985 | Japan | 264/22 |
| 61-69413 | 4/1986 | Japan | 264/22 |
| 61-123526 | 6/1986 | Japan | 264/22 |
| 204236 | 9/1986 | Japan . | |
| 62-275734 | 11/1987 | Japan | 264/298 |

OTHER PUBLICATIONS

Patent Application Ser. No. 863,672, filed 5/15/86, "Fast Ultraviolet Radiation Curing Silicone Composition".
Patent Application Ser. No. 118,086, filed 11/6/87, "UV Curable Conformal Coating with Moisture Shadow Cure".
Patent Application Ser. No. 118,146, filed 11/6/87, "Composition Having UV Cure with Moisture Shadow Cure".

Primary Examiner—Jeffery Thurlow
Attorney, Agent, or Firm—Roger H. Borrousch

[57] ABSTRACT

Focusing radiation on a patterned area of a substrate upon which flowable radiation curable material is being deposited causes a dam of cured material to form which restricts the flow of the material into areas which are to remain free of material.

10 Claims, 5 Drawing Sheets

METHOD OF CONTROLLING FLOW BY A RADIATION FORMED DAM

BACKGROUND OF THE INVENTION

1. Field of the Invention

This invention relates to a method of restricting the flow of flowable radiation curable material by forming a dam of the material.

2. Background Information

In the art of making bosses, restriction of a liquid plastic was accomplished by pouring it onto the surface to form a protrusion which remained due to surface tension. Improvement to get better relief and definition was accomplished by flowing the liquid plastic to a sharp peripheral edge or it was poured into a cavity. To achieve this sharp peripheral edge, a retaining edge or dam was screened onto the face of a plastic sheet. The dam then acted as a retaining wall to hold the liquid plastic. The screen processes are complex and the results were not as good as desired. In U.S. Pat. No. 4,353,858, issued Oct. 12, 1982, Gilleo et al described a method of making a dam to retain a liquid plastic. The dam is formed by using a debossing die and impressing it into a heated thermoplastic substrate to form the dam. Gilleo et al in U.S. Pat. No. 4,409,264, issued Oct. 11, 1983, teach another method of retaining liquid plastic by forming a pattern on a surface. The pattern is formed by a contiguous low energy surface having a surface energy of between about 5 and about 20 dynes/cm, as the retaining means. Liquid resin is introduced to the pattern area in a quantity sufficient to form a liquid resin surface elevated above the article surface and in a quantity insufficient to flow past the retaining means due to the force of gravity.

Whereas the above methods may be useful for forming bosses made from plastics, the present invention relates to the use of flowable radiation curable material on substrates which can be hard or flexible materials, including thermoset materials, glass, metal, ceramic, and the like. The substrate can be planar, with or without being populated with devices such as electronic devices. The substrate is to be coated with the flowable radiation curable material in certain defined areas. The problem faced was how to coat only defined areas with flowable radiation curable material in an efficient manner.

SUMMARY OF THE INVENTION

This invention relates to a method for restricting flow of a flowable radiation curable material comprising forming a dam of such material by exposing a portion of the material to radiation of sufficient intensity to cause curing of the exposed portion.

This invention also relates to a method comprising dispensing a flowable radiation curable material onto a substrate, exposing a predetermined area of the substrate to radiation whereby a dam of cured material is formed and the flow of the flowable radiation curable material is prevented from flowing beyond the dam, and thereafter, exposing to radiation the remainder of the flowable radiation curable material dispensed on the substrate in a dose sufficient to cure the material.

Another embodiment of this invention is a method comprising exposing a predetermined area of a substrate to radiation where the predetermined area defines a region of the substrate which is to remain free of a flowable radiation curable material, dispensing the flowable radiation curable material onto the substrate, whereby a dam of cured material is formed when the flowable radiation curable material flows into the radiation exposed area and the flowable radiation curable material is prevented from flowing beyond the dam into the region of substrate which is to remain free of the flowable radiation curable material, and therafter, exposing to radiation the remainder of the flowable radiation curable material dispensed on the substrate in a dose sufficient to cure the material.

A further embodiment of this invention is a method comprising exposing a patterned area of a substrate to radiation where the patterned area defines a region of the substrate which is to remain free of a flowable radiation curable material, dispensing the flowable radiation curable material onto the substrate, whereby a dam of cured materials is formed when the flowable radiation curable material flows into the radiation exposed area which prevents further flow of the flowable radiation curable material beyond the dam into the region of the substrate which is to remain free of the flowable radiation curable material, and thereafter, exposing to radiation the remainder of the flowable radiation curable material dispensed on the substrate with a dose sufficient to cure the material.

This invention further relates to a method comprising dispensing a flowable radiation curable material onto a radiation transparent substrate, exposing a predetermined area of the substrate to radiation where the radiation passes through the substrate curing the material exposed to the radiation and forming a dam which restricts the flow of flowable radiation curable material, and thereafter, exposing to radiation the remainder of the flowable radiation curable material dispensed on the substrate in a dose sufficient to cure the material.

Figure 1:
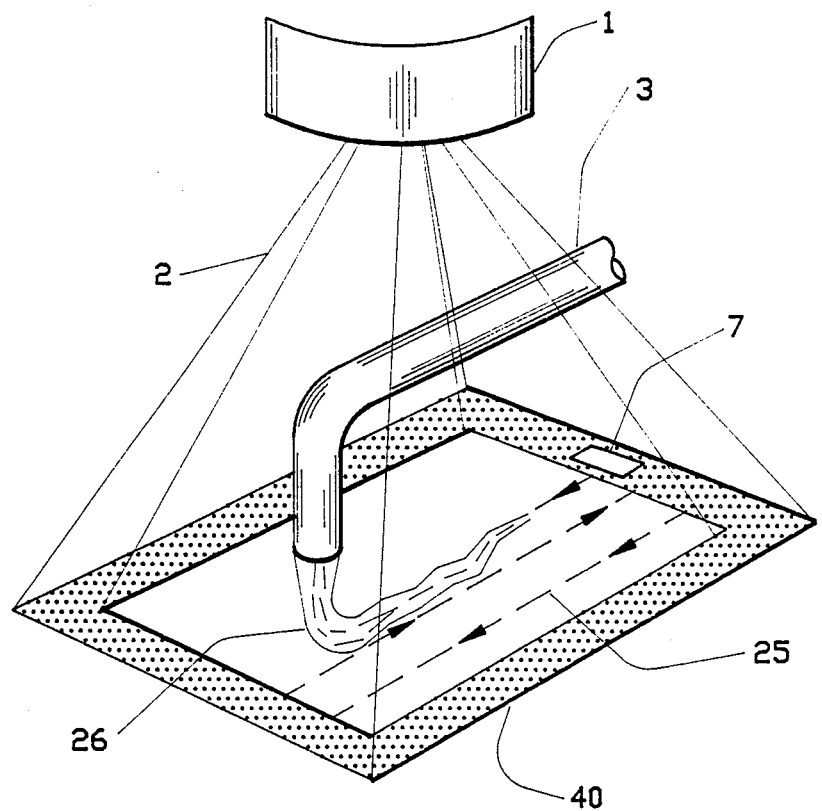
FIG. 1 is a perspective of an embodiment of this invention where flowable radiation curable material is being deposited on a substrate with patterned radiation to form a perimeter dam.

LIST OF REFERENCE NUMBERS WITH DEFINITION 1 source of radiation and focusing means
2 radiation
3 non-reflective dispenser
4 cured material
5 flowable radiation curable material
7 shadow cast by non-reflective dispenser
8 substrate, planar
9 radiation mask for perimeter dam formation
10 optical fiber radiation guides
11 radiation mask for patterning radiation through a transparent substrate
12 radiation transparent substrate
13 window through which radiation can pass
14 window through which radiation can pass
15 window through which radiation can pass
16 housing for radiation source with focusing ports
17 optical transmitter substance
18 radiation control surface
19 refracted radiation
20 area to remain free from flowable radiation curable material
21 dam of cured material
25 path taken by dispenser in depositing flowable radiation curable material
26 flowable radiation curable material being dispensed
40 perimeter pattern

DESCRIPTION OF THE EMBODIMENTS

The method of this invention restricts the flow of a flowable radiation curable material by radiation-controlled cure damming. A dam which restricts the flow is formed by exposing a portion of flowable radiation curable material to radiation. The exposed portion cures to form the dam. For the purposes of this invention, "flowable" means the material will flow by the force of gravity. The situation where the flow-out is rapid, such that it would cover the substrate surface in a matter of seconds or fractions of a second, is particularly important to have the flow controlled so that only the desired areas are covered with the flowable radiation curable material. The flow-out is controlled on a planar surface by curing the perimeter of a defined area using radiation, such as ultraviolet radiation. When the radiation and flowable radiation curable material occupy the same area, the material cures to a solid and forms the dam which limits the flow of curable material. After the amount of flowable radiation curable material appropriate for the application is dispenses, the radiation pattern can be changed to expose the entire dispensed curable material to the radiation causing cure, alternatively the source of radiation can be changed to expose the entire curable material to radiation for cure.

This method may be termed an "in-situ" method of forming dams or barriers to restrict or restrain flowable radiation curable material. For example, a source of ultraviolet radiation is focued on a region where it is desired to have the flow of material restricted, i.e. to stop from going beyond a point. When the flowable radiation curable material enters the area exposed with radiation, it cures and forms a dam. The height of the dam can be regulated by continuing to have material flow into the exposure area.

The flowable radiation curable material is intended to be a material which is useful for flow coating applications in which the material is intended to flood the substrate to which it is applied. The cured dam creates a perimeter dike to restrain the uncured liquid while it flows out to coat the area within the boundaries of the dam. The characteristics of the flowable radiation curable material which can determine the degree of success include the cure rate, the amount of dosage needed to cure the material, the viscosity of the material, and the surface tension. Materials with low surface tension and low viscosities and fast cure rates will provide the best dam definitions.

Figure 2:
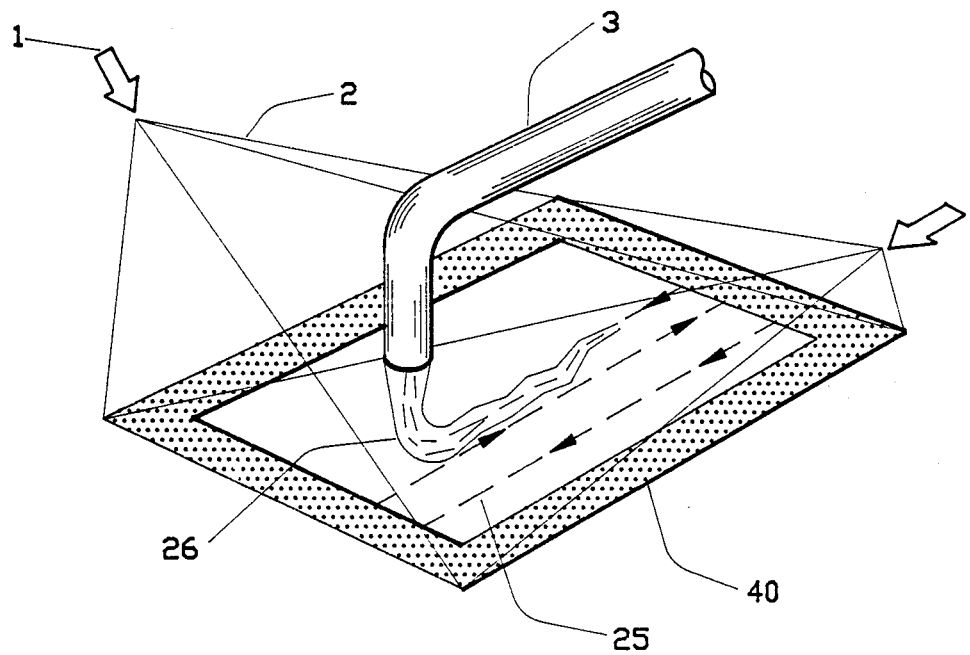
FIG. 2 is a perspective similar to FIG. 1 but having more than one radiation source and more than one focusing direction.

An embodiment of this invention is shown by FIG. 1 in which the perspective illustrates a source of radiation and focusing means 1 forming a perimeter pattern 40 from radiation 2 being directed onto the substrate and flowable radiation curable material in a focused manner. The source of radiation can be any of those which are well known in the art and any source can be used, so long as the kind of radiation and its intensity are suitably selected to match the cure of the material. The radiation can be ultraviolet radiation, electron beam radiation, and visible light, for example. Ultraviolet radiation is preferred. Focusing means and techniques are also well known in the art. The flowable radiation curable material being dispensed 26 from a non-reflective dispenser 3 onto a substrate where the dispenser 3 follows a path 25, for example, in depositing the curable material such that material 26 which is deposited in the perimeter pattern 40 cures to form a dam of cured material. The dispenser 3 should be made of a non-reflective material, so that the raditaion pattern 40 which is being focused on the substrate is not compromised. The dispenser 3 will cause a shadow 7 to be cast on the substrate, but as the dispenser 3 moves back and forth across the substrate depositing the flowable radiation curable material 26, the shadow 7 moves and a dam of cured material will be formed completely around the perimeter pattern 40. The drawings show one dispenser 3, but it is within the scope of this method to use more than one dispenser. It may be advantageous to use more than one dispenser where the substrate is complex with devices or other protrusions or two or more different flowable radiation curable materials might be used. FIG. 2 is very similar to the embodiment of FIG. 1 except that there are two sources of radiation and focusing means 1 which are at such positions that the shadow 7 which is observed in the illustration of FIG. 1 is not present. This embodiment illustrates how one might eliminate shadow 7 which would be significant where the flowable radiation curable material has a sufficiently low viscosity or a long cure time that a shadow might delay the formation of a dam for a sufficient period of time that flow could go beyond the desired boundary. Using two sources of radiation 1 can result in increase cure rate.

FIG. 1 is an embodiment which could be used to flow coat a substrate such as a printed circuit board with an ultraviolet radiation curable encapsulant.

Figure 3:
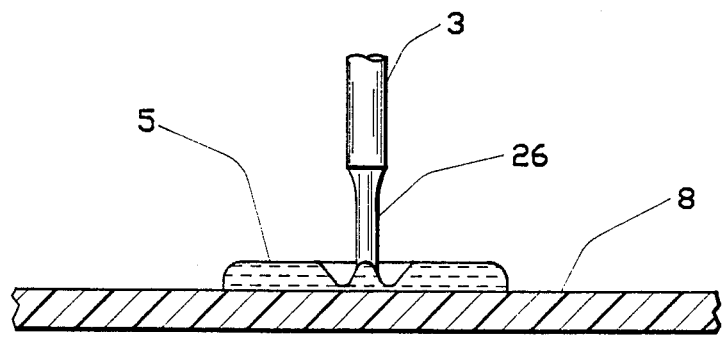
FIG. 3 is a cross sectional view of a flowable radiation curable material being deposited on a substrate.
Figure 4:
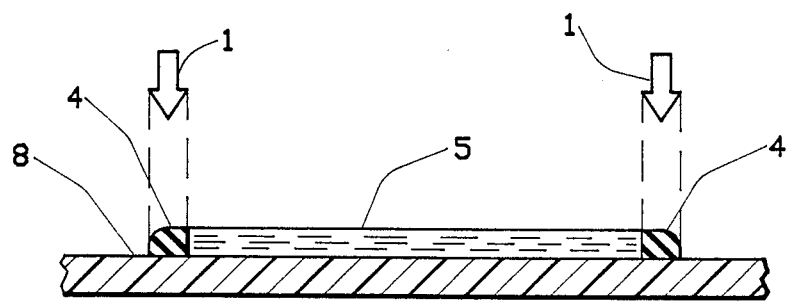
FIG. 4 is a cross sectional view of patterned radiation focused on the perimeter where it formed a dam of cured material with flowable radiation curable material being restrained by the dam.
Figure 5:
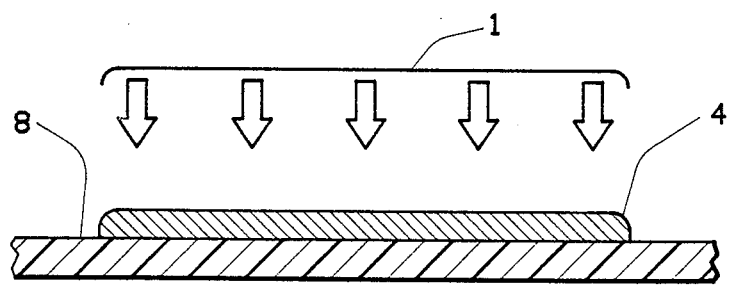
FIG. 5 is a cross sectional view of FIG. 4 after the entire flowable radiation curable material was exposed to radiation and cured.

FIGS. 3, 4, and 5 provide snap shots of the steps which an embodiment such as shown by FIG. 1 and FIG. 2 go through during the method. In FIG. 3, flowable radiation curable material 5 is being dispensed 26 from dispenser 3 onto substrate 8 which has a planar surface. The radiation pattern can be focused on the substrate just prior to material 5 being dispensed, at the same time as material 5 begins dispensing, or just after material 5 begins dispensing onto the substrate. As the material 5 flows out after being dispensed, it will flow until it reaches the focused radiation from source 1, and form a dam of cured material 4. The formed dam of cured material 4 with the uncured, flowable radiation curable material 5 on substrate 8 is shown by FIG. 4. FIG. 5 shows the resulting product obtained by changing the focus of the radiation so that the source exposed all the flowable radiation curable material 5 to the radiation causing it to cure or alternatively a different source of radiation can be used. The substrates can be made of materials which are flexible or hard. Substrates which are useful in the electronics industry are particularly preferred. The materials of the substrate can be organic materials, composites such as impregnated fibrous materials, glass, metal, or ceramics.

Figure 6:
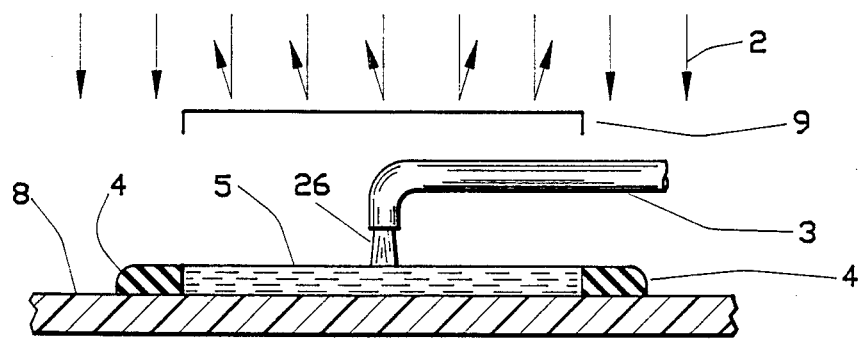
FIG. 6 is a cross sectional view of a flowable radiation curable material being deposited on a substrate and radiation is being patterned by a mask to form a dam of cured material, an embodiment of this invention.
Figure 7:
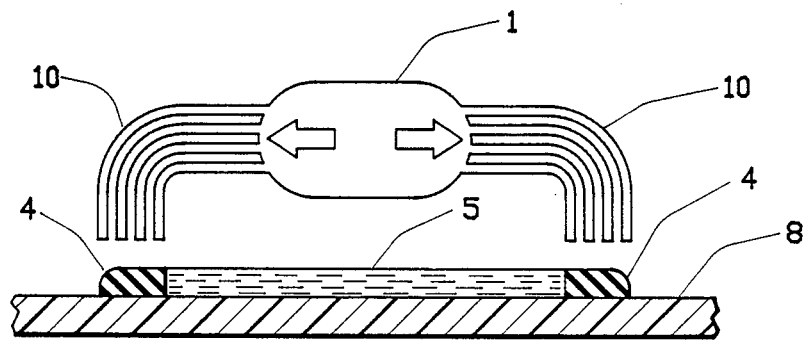
FIG. 7 is a cross sectional view of a flowable radiation curable material being deposited on a substrate with radiation being patterned by the use of optical fiber radiation guides to form a dam of cured material, an embodiment of this invention.

An embodiment of the present invention is found in FIG. 6 in which a mask 9 is used to prevent radiation 2 from exposing the flowable radiation curable material 5 except for the portion which is to form a dam of cured material 4. The material 5 flowing 26 from dispenser 3 should be allowed to flow to form the proper coating thickness and cover the desired area. The flow, however, needs to be controlled by the formation of dams. FIG. 7 illustrates another kind of focusing means for the radiation i.e. the use of optical fiber radiation guides 10. The use of optical fiber radiation guides 10 are valuable where the dams are small or complex so that the focus must be carefully controlled. The use of optical fiber radiation guides can be used where the substrate must not be exposed to heating. The guides allow the radiation source which can generate heat to be some distance from the material to be cured.

Figure 8:
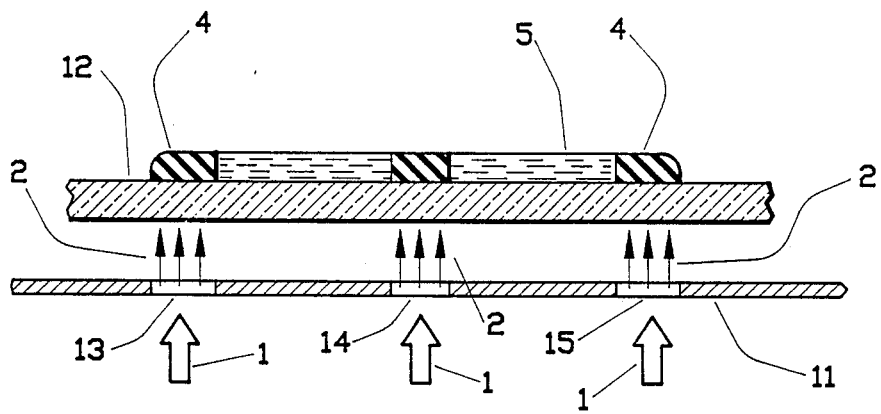
FIG. 8 is a cross sectional view of an embodiment of this invention of a flowable radiation curable material on a radiation transparent substrate where the radiation is patterned by passing through a mask and through the substrate to form cured material dams.

FIG. 8 shows an example of an embodiment which allows the radiation 2 to be passed through a radiation transparent substrate 12 to reach the flowable radiation curable material 5 on the other side of the transparent substrate 12 to cause the dams of cured material 4 to form. In this illustration a mask 11 is used to focus the radiation 2 from source 1 by allowing it to pass only through windows 13, 14, and 15. In this illustration, the versatility of the method of the present invention can be seen.

Figure 9:
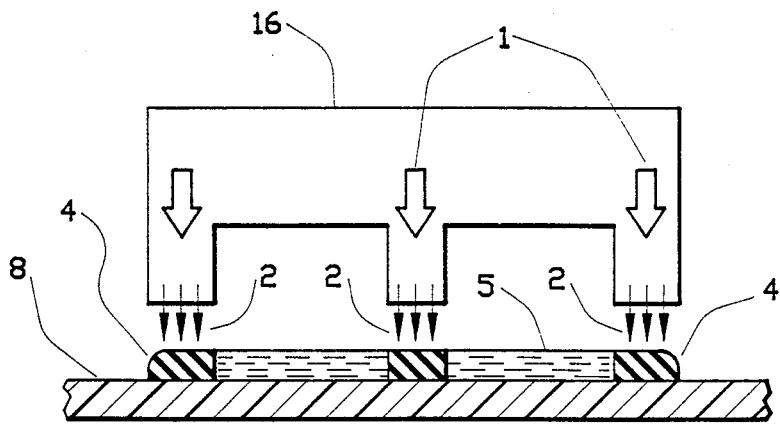
FIG. 9 is a cross sectional view of dams formed by patterned radiation on a flowable radiation curable material using a housing to specifically direct the radiation an embodiment of this invention.
Figure 10:
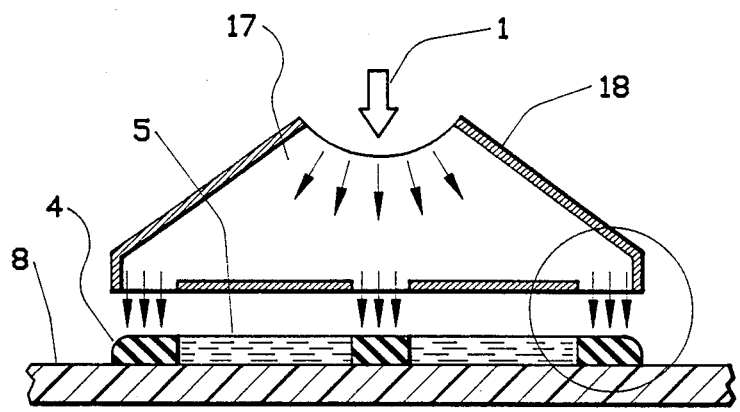
FIG. 10 is a cross sectional view of dams formed by patterned radiation on a flowable radiation curable material by using radiation being patterned by passing through an optical transmitter, an embodiment of this invention.

FIG. 9 and FIG. 10 show embodiments of the present invention which illustrates the different kinds of focusing means for the radiation. FIG. 9 shows a special housing 16 for the radiation source with focusing ports. FIG. 10 shows the radiation source 1 passing the radiation 19 through optical transmitter substance 17 having a radiation control surface 18 to contain the radiation. Optical transmitter substance 17 can be a radiation transparent material, such as a fluid, a gel, or solid. Substance 17 can be in a container where the radiation control surface 18 is a blackened surface which absorbs the radiation or the surface can be mirrored to focus the radiation. Substance 17 can be quartz where the radiation control surface 18 is mirrored or silvered and could be used to focus the radiation.

Figure 11:
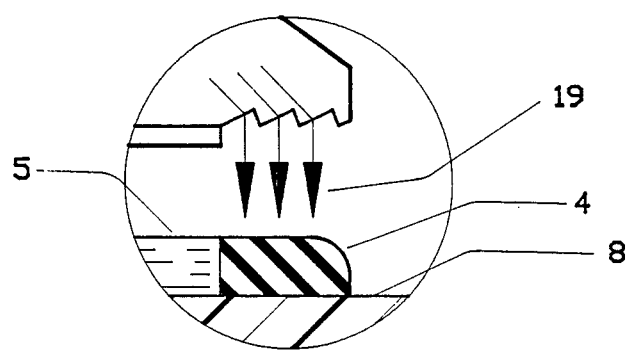
FIG. 11 is a fragment of a cross section of an embodiment similar to the embodiment of FIG. 10 except that it shows the radiation being refracted by a lens.

FIG. 11 is a fragment of a cross section of an embodiment similar to the embodiment of FIG. 10. FIG. 11 shows a dam formed by refracted radiation 19 resulting from the radiation passing through a lens which directs it to the pattern area for the formation of the dam of cured material 4.

Figure 12:
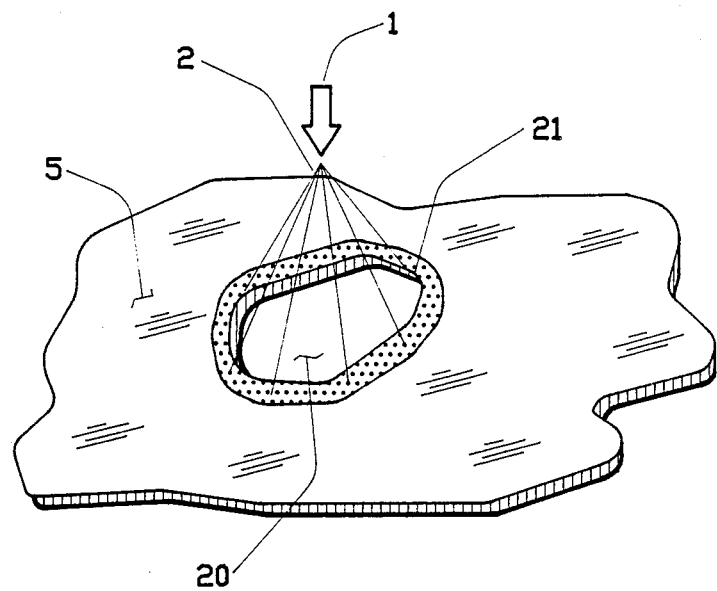
FIG. 12 is a perspective of an embodiment of this invention where radiation is being patterned to form a dam to keep flowable radiation curable material from flowing into an area.
Figure 13:
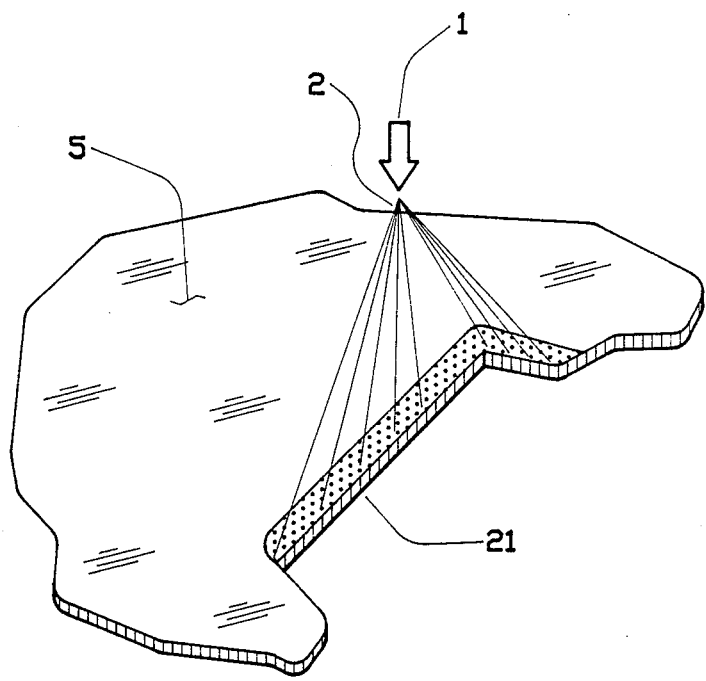
FIG. 13 is a perspective of an embodiment of this invention where radiation is being patterned to form a dam to keep flowable radiation curable material from flowing into an area.

FIG. 12 and FIG. 13 are perspective of the present invention which shows that the dam of cured material need not be used only as a perimeter to restrain flowable radiation curable material within its boundaries but can be used to exclude flowable radiation curable material from entering an area. Cured material forms a dam 21 and flowable radiation curable material 5 is excluded from area 20 which is to remain free of material.

The flowable radiation curable material can include organic materials and silicone materials which can be cured by radiation, including ultraviolet radiation, electron beam radiation, and visible light. Some of these curable materials include compositions based on acrylated utethanes compositions, organosiloxane compositions based on vinyl-containing organosiloxane polymers and mercaptan compounds including organic mercaptans and mercaptoorganosiloxane polymers, and organosiloxane compositions based on acrylated or methyacrylated siloxane polymers and acrylamide siloxane polymers. The organosiloxane polymers and mercaptan compounds are described in a patent application entitled "Fast Ultraviolet Radiation Curing Silicone Composition" by Chi-long Lee and Michael A. Lutz, assigned to the same assignee as the present application, and has a Ser. No. 863,672, filed May 15, 1986, now U.S. Pat. No. 4,780,486, issued Oct. 25, 1988, which is hereby incorporated by reference to show the compositions. The organosiloxane compositions based on acrylated or methyacrylated siloxane polymers and acrylamide siloxane polymers are described in a patent application entitled "UV Curable Conformal Coating With Moisture Shadow Cure" by Beth I. Gutek, assigned to the same assignee as the present application, and has a Ser. No. 118,086, filed Nov. 6, 1987, which is incorporated by reference to show the compositions. Another patent application showing the organosiloxane compositions based on acrylated or methyacrylated siloxane polymers and acrylamide siloxane polymers is incorporated by reference to show such compositions and is entitled "Composition Having UV Cure With Moisture Shadow Cure" by Beth I. Gutek, assigned to the same assignee as the present application, and has a Ser. No. 118,146, filed Nov. 6, 1987, now abandoned and a continuation-in-part application Ser. No. 200,827, was filed Jun. 1, 1988. The compositions which are curable by ultraviolet radiation include photoinitiators and other appropriate ingredients. The compositions which are cured by electron beam radiation do not require the presence of photoinitiators, but can have other appropriate ingredients. The compositions which are curable by visible light include the photoinitiators and activators which are required for cure, as well as other appropriate ingredients.

The method of this invention reduces or eliminates the need for auxiliary methods for forming restraints where the material flows to coat only desired areas. The entire surface of a substrate could constitute the desired area to be coated. In this case, the dam is used to prevent the flowable radiation curable material from flowing over the edges which would waste valuable material, cause a clean up problem, and could be a hazard. This method allows definition of a pattern which can be readily varied by adjusting the exposure pattern of the radiation. Such adjustments can be built into the equipment and even computerized for different substrates. This method enables the user to avoid coating discrete areas within the coating area by restricting the flow into those discrete areas. This method can reduce costs by eliminating material waste and reduce costs by eliminating multiple processing steps.

The method of this invention can be used to coat and/or encapsulate printed circuit boards, plastic pin grid arrays (PPGA), tape automated bonding (TAB) devices, hybrid circuit substrates, chip on board encapsulation, and encapsulation of devices which contain holes which are to remain free of material.

A planar substrate was coated with a commercially available composition of the type based on vinyl-containing organosiloxane polymer and a mercaptan compound in which the technique was as illustrated by FIG. 6 where a radiation mask 9 was used. The composition was applied to the substrate under the mask while it was being exposed to ultraviolet radiation from a medium pressure mercury vapor arc lamp housed in a LCU Model 750 A ultraviolet curing unit manufactured by UVEXS, Inc. from Mountain View, Calif. The composition was a flowable ultraviolet radiation curable coating material which can cure in less than one second. The coating material flowed to the edge of the shadow may be by the mask and where the substrate was exposed to radiation, it immediately cured in this exposed area and formed a dam about one fourth inch high. After the dam was formed, the mask was removed and the entire surface of the coated substrate was exposed to ultraviolet radiation to cure the coating material which was previously in the shadow under the mask.

That which is claimed is:

1. A method for restricting flow of a flowable radiation curable material comprising forming a dam of such material by exposing a portion of the material to radiation of sufficient intensity to cause curing of the exposed portion, where the flowable radiation curable material is dispensed onto a substrate during exposure by radiation onto the substrate in a pattern which restricts the flow by dam formation.

2. The method according to claim 1 in which the process of exposing a portion of the material is done by focusing the radiation through an optical transmitter substance having a radiation control surface.

3. The method according to claim 1 in which the process of exposing a portion of the material is done by focusing through optical fiber radiation guides.

4. A method comprising
   dispensing a flowable radiation curable material onto a substrate.
   exposing a predetermined area of the substrate to radiation whereby a dam of cured material is formed and the flow of the flowable radiation curable material is prevented from flowing beyond the dam, where the exposing of the predetermined area of the substrate occurs during the dispensing of the flowable radiation curable material onto the substrate, and thereafter,
   exposing to radiation the remainder of the flowable radiation curable material dispensed on the substrate in a dose sufficient to cure the material.

5. A method comprising
   exposing a predetermined area of a substrate to radiation where the predetermined area defines a region of the substrate which is to remain free of a flowable radiation curable material,
   dispensing the flowable radiation curable material onto the substrate, whereby a dam of cured material is formed when the flowable radiation curable material flows into the radiation exposed area and the flowable radiation curable material is prevented from flowing beyond the dam into the region of substrate which is to remain free of the flowable radiation curable material, where the exposing of the predetermined area of the substrate occurs during the dispensing of the flowable radiation curable material onto the substrate, and thereafter,
   exposing to radiation the remainder of the flowable radiation curable material dispensed on the substrate in a dose sufficient to cure the material.

6. The method according to claim 5 in which the radiation exposing the predetermined area is focused by using optical fiber radiation guides.

7. The method according to claim 5 in which the radiation exposing the predetermined area is focused by passing the radiation through an optical transmitter substance having a radiation control surface.

8. A method comprising
   exposing a patterned area of a substrate to radiation where the patterned area defines a region of the substrate which is to remain free of a flowable radiation curable material,
   dispensing the flowable radiation curable material onto the substrate, whereby a dam of cured material is formed when the flowable radiation curable material flows into the radiation exposed area which prevents further flow of the flowable radiation curable material beyond the dam into the region of the substrate which is to remain free of the flowable radiation curable material, where the exposing of the patterned area of the substrate occurs during the dispensing of the flowable radiation curable material onto the substrate, and thereafter,
   exposing to radiation the remainder of the flowable radiation curable material dispensed on the substrate with a dose sufficient to cure the material.

9. The method according to claim 8 in which the patterned area is formed from a mask which blocks the radiation from exposing an area on the substrate where the flowable radiation curable material is being dispensed and as the curable material flows into the exposed area it cures to form a dam.

10. A method comprising
    dispensing a flowable radiation curable material onto a radiation transparent substrate,
    exposing a predetermined area of the substrate to radiation where the radiation passes through the substrate curing the material exposed to the radiation and forming a dam which restricts the flow of flowable radiation curable material, where the exposing of the predetermined area of the substrate occurs during the dispensing of the flowable radiation curable material onto the substrate, and thereafter,
    exposing to radiation the remainder of the flowable radiation curable material dispensed on the substrate in a dose sufficient to cure the material.

* * * * *